US010930348B1

(12) United States Patent
Li et al.

(10) Patent No.: US 10,930,348 B1
(45) Date of Patent: Feb. 23, 2021

(54) CONTENT ADDRESSABLE MEMORY-ENCODED CROSSBAR ARRAY IN DOT PRODUCT ENGINES

(71) Applicant: Hewlett Packard Enterprise Development LP, Houston, TX (US)

(72) Inventors: Can Li, Palo Alto, CA (US); Catherine Graves, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/539,868

(22) Filed: Aug. 13, 2019

(51) Int. Cl.
  *G11C 15/00* (2006.01)
  *G11C 15/04* (2006.01)
  *G11C 11/408* (2006.01)
  *G11C 11/413* (2006.01)
  *G11C 8/12* (2006.01)

(52) U.S. Cl.
  CPC .............. *G11C 15/04* (2013.01); *G11C 8/12* (2013.01); *G11C 11/4087* (2013.01); *G11C 11/413* (2013.01)

(58) Field of Classification Search
  CPC ........... G11C 15/04; G11C 8/08; G11C 15/00; G11C 11/412; G11C 15/043; G11C 16/12; G11C 8/14; G11C 11/161; G11C 15/02; G11C 19/08; G11C 7/1096; G11C 7/06; G11C 29/56; G11C 11/565; G11C 29/12; G11C 29/32; G11C 11/1659; G11C 11/1673; G11C 11/1675; G11C 15/046; H01L 23/528; H01L 23/552; H01L 27/0886; H01L 27/1052; H01L 27/226; H01L 43/065; H01L 43/10
  USPC ....... 365/49.17, 203, 207, 129, 189.05, 190, 365/205, 49.18, 49.1, 189.07, 49.16, 200, 365/227, 230.03, 154, 201, 230.06, 365/185.25, 189.06
  See application file for complete search history.

(56) References Cited

U.S. PATENT DOCUMENTS

2020/0075099 A1\* 3/2020 Choi ..................... G11C 15/02

\* cited by examiner

*Primary Examiner* — Thong Q Le
(74) *Attorney, Agent, or Firm* — Sheppard Mullin Richter & Hampton LLP

(57) ABSTRACT

A reprogrammable dot product engine ternary content addressable memory (DPE-TCAM) is provided. The DPE-TCAM comprises a TCAM crossbar array comprising a plurality of match lines and a plurality of search lines. Each search line and match line are coupled together by a memory cell. A plurality of search line drivers are configured to apply a voltage signal to the search lines representing bits of a search word. Current sensing circuitry is coupled to the output of the plurality of match lines and configured to sense a current on the match lines, the sensed current indicating whether the search word and a stored word matched and, if not, the degree of mismatch between the two words.

20 Claims, 8 Drawing Sheets

US 10,930,348 B1

CONTENT ADDRESSABLE MEMORY-ENCODED CROSSBAR ARRAY IN DOT PRODUCT ENGINES

DESCRIPTION OF RELATED ART

Content addressable memory (CAM) is a type of memory that can perform a search operation in which a data string may be input as search content and the resulting output is an address of a location in the memory that stores matching data. This is in contrast to a read operation in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

Ternary CAM (TCAM) is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
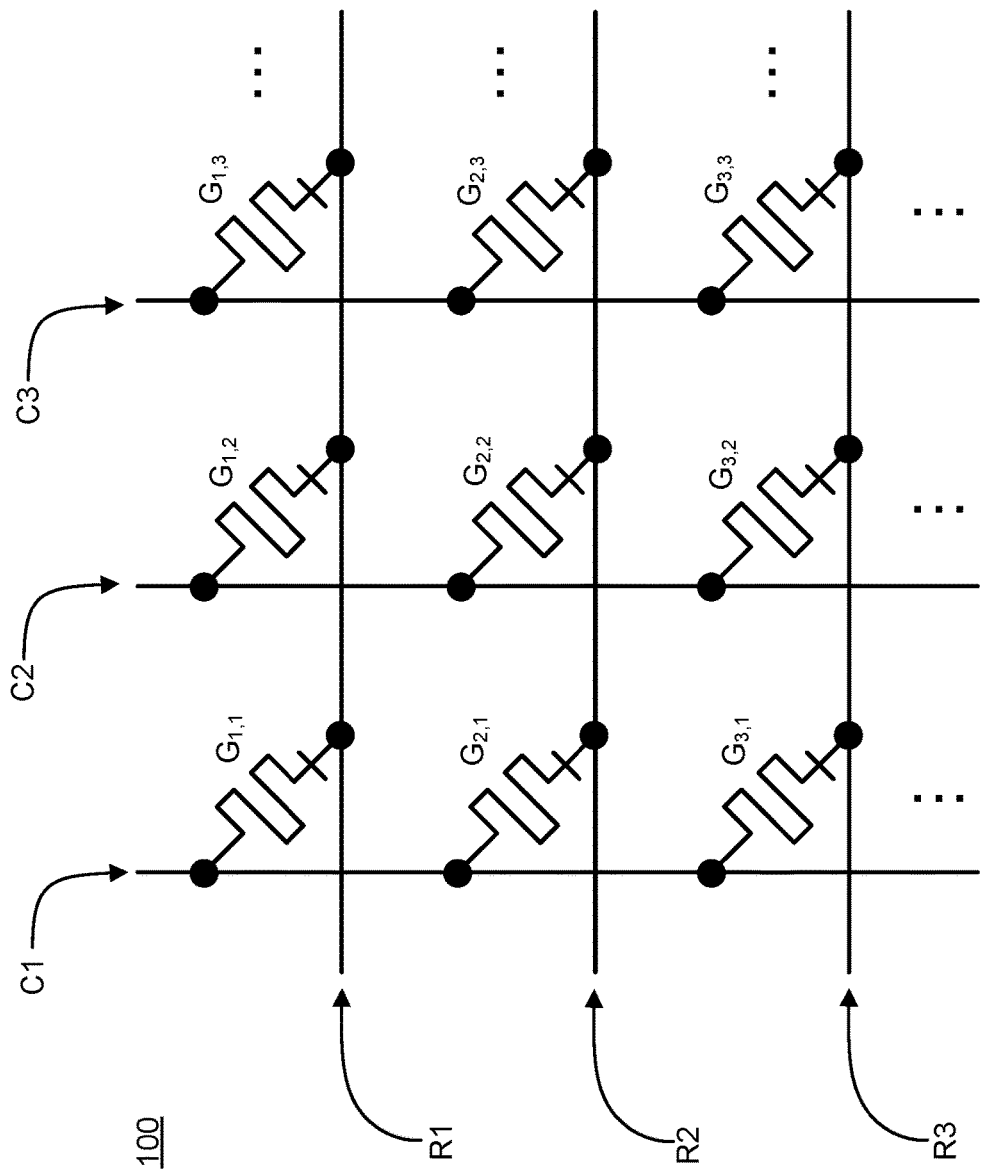
FIG. 1 illustrates an example crossbar array in accordance with embodiments of the technology disclosed herein.

The figures are not exhaustive and do not limit the present disclosure to the precise form disclosed.

DETAILED DESCRIPTION

Content addressable memory (CAM) is a special type of memory generally used in high-speed search application. CAMs comprise hardware (circuitry) that compares an input pattern against stored binary data. The stored data of a CAM is not access by its location, but rather access is performed based on its content. A word, or "tag," is input to the CAM, the CAM searches for the tag in its contents and, when found, the CAM returns the address of the location where the found contents reside. CAMs are powerful, efficient, and fast. The input patterns and data in CAMs are represented by logic '0' and logic '1's (generally referred to as a binary CAM or bCAM). Reading, writing, and comparing are the three main modes of operation for CAMs. Data stored in CAMs represents the memory address in random access memory (RAM) where the underlying data sought is stored. If the data in RAM is to be accessed, the CAM is searched for the address associated with that desired data, with the memory address being retrieved from the CAM. In a binary CAM, an input search word is compared to a table of stored words through search lines and, if a match is found for the input search word in the stored CAM words, the CAM returns the address of the matching data to an encoder. If no match is found in any of the stored words, no match is indicated on the match lines and, in some cases, a flag may be triggered indicating the miss.

Ternary content addressable memory (TCAM) stores and searches for a third value, referred to as a wildcard or "don't care" bit. A stored wildcard bit is treated like a match regardless of whether the search criterion for the bit of the stored data word is a logic '0' or a logic '1.' In this way, TCAMs allow for additional complexity as the input pattern can represent a range of patterns rather than only one pattern. For example, an input pattern of "01XX0" could indicate a match for four separate stored data words: "01000," "01010," "01100," and "01110." One use of TCAMs is in networking, where TCAMs are heavily relied upon for rapid network IP address lookups and implementing access control lists (ACLs).

CAMs and TCAMs are traditionally implemented using an array of bit cells, with each row representing a stored data word and each column representing a specific bit position within the data word. Many prior art CAMs and TCAMs were normally comprised of conventional semiconductor memory (e.g., static random access memory (SRAM)) and comparison circuitry. For example, some prior art CAMs may comprise an array of bit cells, each cell comprising a six transistor (6T) SRAM, while some prior art TCAMs may comprise an array of bit cells with each cell comprising a sixteen transistor (16T) SRAM. In some prior art approaches, one or more transistors within each bit cell (CAM or TCAM) can be replaced with memristors. Memristors are devices that may be used as components in a wide range of electronic circuits, such as memories, switches, radio frequency circuits, and logic circuits and systems. Other types of resistive random access memory (RRAM) devices that may be used instead of memristors includes, but is not limited to, phase change memory (PCM) devices, ferroelectric RAM (FeRAM) devices, spin transfer torque RAM (STT-RAM) devices, and conductive bridge RAM (CBRAM), among others.

Even where additional devices are used in the memory to replace transistors, these types of alternative bit cells are designed to function in the same way as the conventional all-transistor devices. That is, a memristor-based TCAM is still encoded to operate the same as a conventional SRAM-based TCAM where the full digital and binary match result (searched vs. stored) is given. Although memristors or other RRAM devices can be used to replace transistors, thereby providing some efficiency benefit to the CAM or TCAM, the different circuit designs still operate in a similar manner to get the same type of result. This result is a binary answer—the search word matches the data word (e.g., the voltage on the precharged match line remains high) or the search word does not match the data word (e.g., the voltage on the precharged match line is pulled down by switching a transistor). Search operations of this kind provide a high-level response that may be used to identify when a match or mismatch occurs. However, emerging applications require not only search capabilities but also functionality for determining the similarity between a search word and a data word. Conventional TCAMs are not capable of determining the degree to which the search word and data word match, except if there is a total match (i.e., all bits match). Such an operation would need to be a post-search function conducted through additional circuitry outside of the TCAM cell.

Embodiments of the present disclosure provide a memory structure for CAMs, TCAMs, or other content-based searchable memories which accelerates the similarity searching capabilities. As discussed in greater detail below, embodiments of the present disclosure propose a crossbar array-based TCAM structure, wherein multiple memristor or other RRAM devices are programmed to serve as a single cell within the TCAM. In essence, the multiple devices represent one ternary cell in a conventional TCAM structure. Utilizing the crossbar array enables embodiments of the present disclosure to accelerate similarity searching that operates not only in a pure match/mismatch mode (i.e., outputting the full binary result like current CAM devices), but can also be configured to detect the number of mismatched bits between the searched word and the stored word. This lower level granularity allows for CAM devices to be utilized in new applications, such as genomic sequencing. Each row of the crossbar array represents a word storage block comprising a plurality of crossbar cells, each crossbar cell comprising two or three memristors disposed to junction devices. The memristors can be programmed to store a logic value and work together to identify whether a mismatch has occurred. Not only is the binary result of match/mismatch output along each row, but the degree of similarity between the search word and the stored word in the case of a mismatch can also be output along each row. That is, the current sensed along each row can indicate both the binary search result and the similarity result in the same operation.

Vector-matrix processing techniques are prevalent in many computing applications, including data compression, digital data processing, neural networks, encryption, and optimization, among others. Memristor crossbar arrays have successfully demonstrated the ability to perform vector-matrix multiplication very efficiently. For example, an input voltage signal from each row line of the crossbar is weighted by the conductance of the resistive devices in each column line and accumulated as the current output from each column line. The memristor crossbar array is configured to include contributions from each memristor in the crossbar array. The use of memristors at junctions or cross-points of the crossbar array enables programming the resistance (or conductance) at each such junction. Such prior art crossbar arrays are disclosed in U.S. Pat. No. 10,262,733, issued on Apr. 16, 2019, co-pending U.S. patent application Ser. No. 15/570,980, filed Sep. 25, 2015, and co-pending U.S. Patent Application No. 2019/0066780, filed Feb. 19, 2016, each of which is hereby incorporated by reference herein in their entirety.

FIG. 1 illustrates an example crossbar array 100 in accordance with embodiments of the present disclosure. Crossbar array 100 can be a N×M-sized array, comprising N number of rows and M number of columns. Although discussed with respect to crossbar array 100, the description should not be interpreted as being limited only to crossbar array 100. For ease of discussion, only a portion of the entire crossbar array 100 is illustrated. As shown in FIG. 1, crossbar array 100 includes a plurality of row lines R1-R3 running parallel to each other, and a plurality of column lines C1-C3 running parallel to each other. Row lines R1-R3 and column lines C1-C3 may be electrodes that carry current through crossbar array 100, each column line C1-C3 running non-parallel to but disconnected from the row lines R1-R3. In various embodiments, column lines C1-C3 may comprise bottom electrodes disposed below the row lines R1-R3 while in other embodiments the column lines C1-C3 may be disposed above the row lines R1-R3 (i.e., comprise upper electrodes). Both row lines R1-R3 and column lines C1-C3 are configured to supply voltage and current to the memory cells G within crossbar array 100. The row lines R1-R3 and column lines C1-C3 can be made of a variety of different conductive materials, including but not limited to Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $TiSi_3$, $TaSi_2$, $WSi_2$, $NbSi_2$, $V_3Si$, electrically doped polycrystalline Si, electrically doped polycrystalline Ge, and combinations thereof.

A plurality of memory cells G are disposed such that each memory cell G couples a respective combination of one of the lines R1-R3 and one of the column lines C1-C3. As an example, memory cell $G_{1,2}$ is coupled between row line R1 and column line C2. In other words, none of the memory cells G share both a row line and a column line. Although only a 3×3 section of crossbar array 100 is shown, the crossbar array 100 can be of any suitable dimensions. Utilizing a device like crossbar array 100, in a single operational step one can perform N×M multiplications and (N−1)×M additions.

In various embodiments, each memory cell G may be implemented as a memristors. Memristors can be used to store bits of information (i.e., a logic '0' or a logic '1') because the memristor can "memorize" its last resistance state, either in a volatile or non-volatile way. In this manner, each memristor (or other resistive device in other embodiments) can be set to at least two states, while in other embodiments it may be set to multiple resistance states (e.g., for analog operations). The resistance of a memristor may be changed by applying an electrical stimulus, such as a voltage or a current, through the memristor to create different voltage differences across the memristor. In addition to storing logical bits, memristors can also behave as an analog component with variable conductance. In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

For ease of discussion the technology disclosed herein shall be described with respect to a crossbar array comprising a plurality of memristor-based memory cells G. Although discussed in view of such embodiments, a person of ordinary skill in the art would understand that the technology disclosed herein is applicable to other types of resistive RAM devices, such as PCM devices, FeRAM devices, STT-RAM devices, and CBRAM), among others. The resistance of a memristor may be changed by applying an electrical stimulus, such as a voltage or a current, through the memristor. Generally, at least one channel may be formed that is capable of being switched between two states—one in which the channel forms an electrically conductive path ("on") and one in which the channel forms a less conductive path ("off"). In some other cases, conductive paths represent "off" and less conductive paths represent "on."

As discussed above, current TCAM devices comprise a plurality of TCAM cells configured to perform a comparison between a stored memory bit and an input memory bit. In other words, traditional TCAM cells consist of both storage circuitry and comparison circuitry. This increases the size of a given TCAM cell, increasing the overall size of a TCAM implementing those cells. Moreover, the large amount of circuit elements required to form the TCAM cell can limit the effective size of a TCAM device, both in terms of physical space as well as the number of bits stored per word (i.e., the word length).

Figure 2:
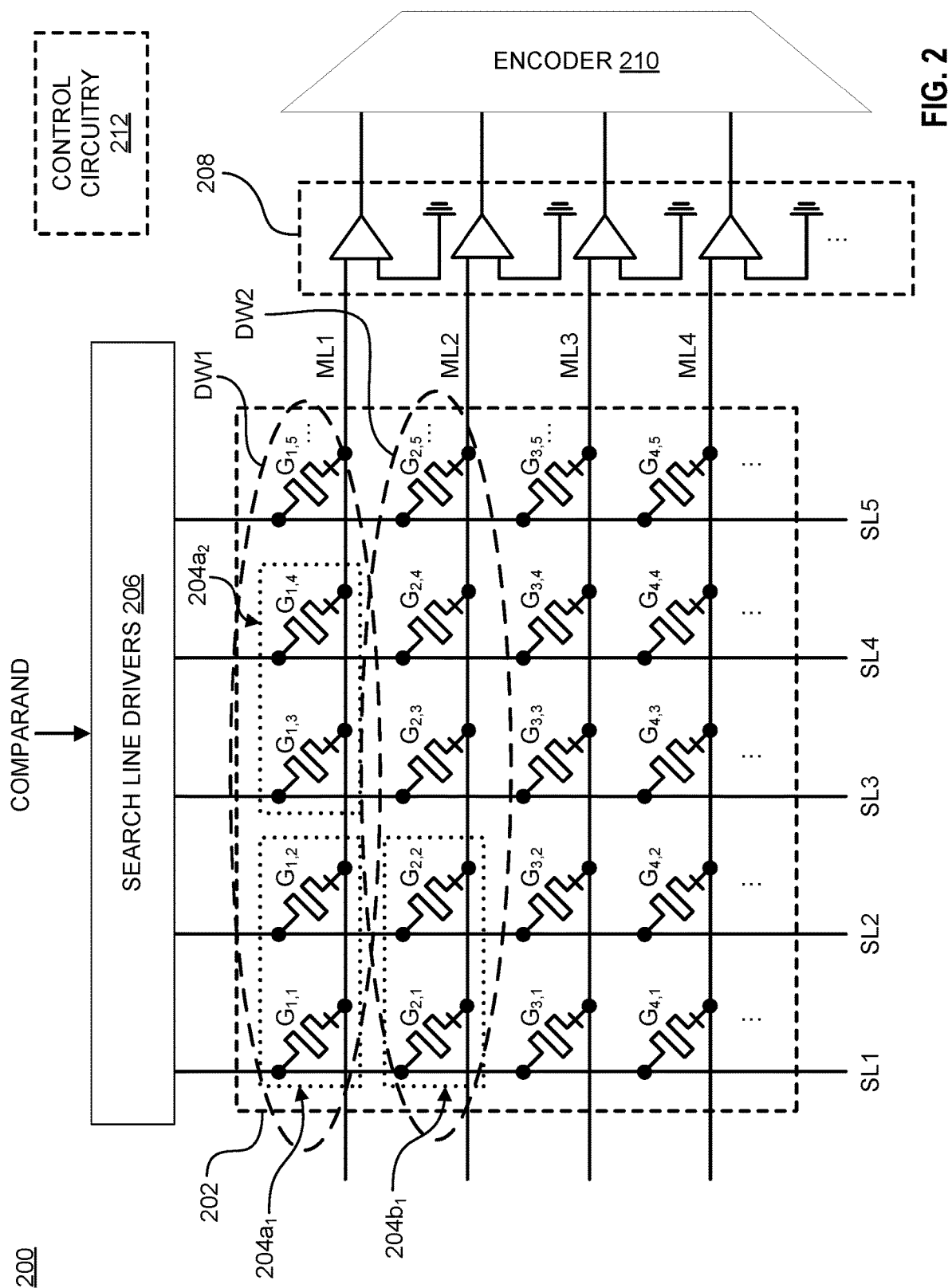
FIG. 2 illustrates an example DPE-TCAM in accordance with embodiments of the technology disclosed herein.

As disclosed herein, embodiments of the technology enables a memristive crossbar array or dot product engine (DPE) to be encoded to function like a traditional TCAM device. FIG. 2 illustrates an example DPE-TCAM 200 in accordance with embodiments of the present disclosure. Example DPE-TCAM 200 is provided for illustrative purposes only and should not be interpreted as limiting the technology to only the illustrated embodiment. Where common references are used in different figures it should be interpreted that any disclosure associated with the structure, function, and operation of such common references applies equally to all figures. As seen in FIG. 2, DPE-TCAM 200 comprises a TCAM crossbar array 202. The TCAM crossbar array 200 can be similar to the crossbar array 100 discussed with respect to FIG. 1, with each row line Rn and column line Cm being designated as a match line MLn and a search line SLm, respectively. As shown in FIG. 2, each search line SL1-SL5 runs non-parallel to the match lines ML1-ML4 such that one junction or intersection is formed by each search line SL1-SL5 with each match line ML1-ML4. At each junction, a memory cell G is disposed, connecting each search lines SL1-SL5 with each match line ML1-ML4, wherein there are N×M number of memory cells G within a given TCAM crossbar array 202. In various embodiments, each memory cell G can comprise a memristor. In other embodiments, other resistive RAM devices can be used to comprise each memory cell G. In some embodiments, one or more additional circuit elements may be disposed within memory cells G.

DPE-TCAM 200 can include peripheral circuitry associated with TCAM crossbar array 202 used for storage devices. As illustrated, search line drivers 206 can be included, each search line driver 206 configured to apply an associated voltage on a search line SL1-SL5 based on the comparand or search word. This type of driver can be similar to the drivers associated with the vector input discussed in U.S. Pat. No. 10,262,733 (incorporated by reference as stated above). In this way, the same hardware circuitry can be configured to perform a variety of different applications. As shown in FIG. 2, each row of TCAM crossbar array 202 can serve as a match line ML1-ML4. During a search operation, a match between the search word (or comparand) input into the search line drivers 206 and one or more data words DW stored within the TCAM cells 204 is identified along the match lines ML1-ML4. If the voltage on the search line SL matches the state of the memory cell G, no current path is formed between the search line SL and the match line ML, keeping the match line ML current near zero. If, however, there is a mismatch, a current path is formed between a search line and a match line, increasing the current on the match line ML. In various embodiments, digital to analog circuitry may be included on the inputs to the search lines SL1-SL5 and the outputs of match lines ML1-ML4, while in other embodiments analog to digital circuitry can be disposed at those locations. Input signals to the search lines SL1-SL5 and match lines ML1-ML4 can be either analog or digital. In various embodiments, a plurality of current sensing circuitry 208 can be disposed on the outputs of the match lines ML1-ML4 to sense the current on each match line ML1-ML4. This sensed current is inputted into an encoder 210. In various embodiments, the encoder 210 can which generate an address corresponding to a matched data word DW, similar to the function of similar encoders in conventional TCAMs. In various embodiments, the encoder 210 can be configured to return an address for each stored data word DW which is detected as a binary mismatch, but is within a given error rate. As a non-limiting example, the encoder 210 can be configured to generate an address for any matching data word DW and for any data word DW for which only one or two bits were found to mismatch (i.e., a 1-bit error rate or a 2-bit error rate). In some embodiments, the encoder 210 may be configured to output a number representing the number of mismatched bits were detected on the match line. The resolution may vary with respect to the number of mismatched bits that can be identified (e.g., a resolution of five bits, meaning that 1-4 mismatches are expressly identified but 5 or more mismatches are represented by the same output). The bit error rate and resolution terms can be defined by the current sensing circuitry 208, the control circuitry 212, the encoder 210, or other peripheral circuitry (e.g., read circuitry (not pictured in FIG. 2)) in various embodiments.

Control circuitry 212 may also be included to control application of voltages at the inputs of search lines SL1-SL5 and the outputs of match lines ML1-ML4 (i.e., control operation of search line drivers 206, current sensing circuitry 208, and/or encoder 210). In some embodiments, control circuitry 212 can be configured to enable programming or encoding of the TCAM crossbar array 202 and the peripheral circuitry to configure the DPE-TCAM 200 to represent a particular TCAM configuration (i.e., based on the size of each TCAM cell representing a stored data word, as discussed in greater detail with respect to TCAM cells 204 in FIG. 2 and with respect to TCAM cells discussed in FIGS. 3-5). In various embodiments, control circuitry 212 can comprise one or more processing components of a device implementing the DPE-TCAM 200 (e.g., a network switch, router, compute node, etc.), including but not limited to the processors and processing circuitry discussed with respect to FIG. 7 below. In some embodiments, control circuitry 212 can be included within search line drivers 206, current sensing circuitry 208, and/or encoder 210, such that each element comprises its own control.

DPE-TCAM 200 performs the functions of the traditional TCAMs by encoding the TCAM crossbar array 202 such that a plurality of TCAM array cells 204 are logically created. In order to function as a TCAM, each TCAM array cell 204 comprises two memory cells G, allowing for programming of the wildcard bit. That is, two memory cells G are utilized to represent a single ternary value. For example, as shown in FIG. 2 the memory cells $G_{1,1}$ and $G_{1,2}$ are grouped together to create a TCAM cell $204a_1$ and the memory cells $G_{1,3}$ and $G_{1,4}$ create TCAM array cell $204a_2$. The plurality of TCAM cells 204 along a given match line ML1-ML4 comprises a stored data word DW (i.e., each row of TCAM cells 204 comprises a stored data word DW). As illustrated, the TCAM cells $204a_x$ comprise the first data word DW1, the TCAM cells $204b_x$ comprise the second data word. In various embodiments, each data word DW can comprise Y number of TCAM cells 204. Although only two TCAM cells 204 are shown in FIG. 2, the number Y of TCAM cells 204 for each data word DW can vary depending on the number of bits of the required data word DW. Traditional TCAMs are limited in the length of data words that can be stored and searched due to various physical limitations, including the space required to implement traditional transistor-based TCAM cells and the subthreshold leakage inherent in circuits with a large number of transistors. Embodiments of the present disclosure are not so limited because of the minimized subthreshold leakage through the use of memristors, and the lack of precharging each match line ML to perform a TCAM search.

Each memory cell G of a TCAM cell 204 can be programmed independently such that the respective TCAM cell 204 stores a bit of a data word DW, similar to the programming of prior art TCAM cells. However, unlike traditional TCAM cells, the TCAM cells 204 in accordance with the present disclosure do not require both storage circuitry and comparison circuitry. Instead, each memory cell G serves as both storage and comparison circuitry. In acting as storage circuitry, a given memory cell G can be set to a specific resistance state, each resistance state corresponding to a logical bit value. In acting as comparison circuitry, the relationship between the resistance state and the applied voltage results in a particular expected output current on the match line ML, thereby resulting in the comparison functionality for which traditional TCAMs generally need added circuitry to perform. The combination of applied voltage and resistance state results in an output that is similar to an expected match current or an expected mismatch current (discussed in greater detail below). The amount of current passing through each memory cell G indicates the result of the "comparison" of the logical state defined by the applied voltage on the search line SL and the logical state defined by the resistance state of the memory cell G. In this way, additional circuitry is not necessary in order to perform a comparison, reducing the number of circuit elements required, reducing the overall size of the TCAM cell, and reducing the power consumption of the TCAM.

Table 1 illustrates the logical values of each memory cell $G_1$, $G_2$ of a TCAM cell 204 and the associated search lines $SL_1$, $SL_2$ corresponding to a given bit value. For ease of understanding, where referring to search lines and memory cells in the abstract, the notation $SL_1, SL_2, \ldots SL_x$ will be used to reference the search lines, and the notation $G_1, G_2, \ldots G_x$ will be used to reference the memory cells. This notation is different from the notation used when referencing specific search lines (i.e., SL1, SL2, SL5, etc.) or specific memory cells (i.e., $G_{1,2}$, $G_{4,1}$, etc.). A person of ordinary skill in the art would understand the use of such abstract notation to make it easier to describe the technology disclosed herein without need to refer to specific, tangible components.

TABLE 1

| Bit Value | Input $(SL_1, SL_2)$ | Memory $(G_1, G_2)$ |
|---|---|---|
| 0 | (0, 1) | (1, 0) |
| 1 | (1, 0) | (0, 1) |
| X | (0, 0) | (0, 0) |

As shown in Table 1, the logical bit value '0' is represented by two different combinations of values, depending on whether you are referring to the search lines $SL_1$, $SL_2$ or the memory cells $G_1$, $G_2$. For example, a TCAM cell 204 stores a logic '0' when the first memory cell $G_1$ is set to a resistance state corresponding to a logic '1' (i.e., a low resistance state), and the second memory cell $G_2$ is set to a resistance state corresponding to a logic '0' (i.e., a high resistance state). However, a logic '0' is represented on the search lines $SL_1$, $SL_2$ in reverse. That is, a logic '0' is represented by applying a nonzero voltage associated with a logic '0' on the search line $SL_1$ connected to the first memory cell $G_1$, and applying a voltage associated with a logic '1' on the search line $SL_2$ connected to the second memory cell $G_2$. A similar reversed relationship exists with respect to logic bit value '1', although the same logic states exist for both the memory and the input (on the search lines) for representing the wildcard value. Although Table 1 illustrates the combinations in this way, a person of ordinary skill in the art would understand that this is just an illustrative example and that the reverse convention would also work (e.g., bit value '0' is represented on the input as (1,0) and in the memory as (0,1)). One of ordinary skill in the art would appreciate that the technology disclosed herein is applicable as long as the input and the memory are designed with a reverse convention, regardless of the specific logic values comprising the combinations.

Based on the logic states indicated in Table 1, the dot product output of TCAM crossbar array 202 is zero or small enough to be considered zero (i.e., indicating a match) only when the logic value on a pair of search lines $SL_1$, $SL_2$ (i.e., a bit of the search word) is the same as that of the logic value stored by the associated pair of memory cells $G_1$, $G_2$ (i.e., the bit value of a TCAM cell). With reference to FIG. 2, as a non-limiting example, if TCAM cell $204b_1$ stores a logical bit value '0' (i.e., memory cell $G_{2,1}$ stores a logic '1' and memory cell $G_{2,2}$ stores a logic '0'), then a match is indicated if the bit of the corresponding search word (or comparand) is a logical bit value '0' (i.e., search line SL1 has a voltage corresponding to logic '0' applied and search line SL2 has a voltage corresponding to logic '1' applied). Table 2 shows potential dot products and whether it represents a match or a mismatch.

TABLE 2

| Input $(SL_1, SL_2)$ | Memory $(G_1, G_2)$ | Dot Product (Match/Mismatch) |
|---|---|---|
| (0, 1) | (1, 0) | 0 (Match) |
| (1, 0) | (0, 1) | 0 (Match) |
| (0, 1) | (0, 1) | 1 (Mismatch) |
| (1, 0) | (1, 0) | 1 (Mismatch) |
| ANY | (0, 0) | 0 (Match) |
| (0, 0) | ANY | 0 (Match) |

During a search operation, each match line ML1-ML4 is initially uncharged (i.e., no current or voltage is applied to match line ML1-ML4). The comparand is received by control circuitry (not pictured in FIG. 2) and/or search line drivers 206, and the search line drivers 206 apply voltages to each search line SL1-SL5 associated with the value of a corresponding bit of the comparand (search word), as indicated by Table 2. TCAM crossbar array 202 outputs a dot product result on each match line ML1-ML4, the dot product result comprising a cumulative amount of current applied to a match line ML1-ML4 by each mismatched TCAM cell 204. In this way, DPE-TCAM 200 can detect not only a match or a mismatch, but can provide a total number of mismatched bits from a given search based on the sensed current on the associated match line ML1-ML4. That is, DPE-TCAM 200 is capable of performing a similarity search and a word search at the same time, increasing the speed and efficiency of the TCAM operation plus additional similarity functionality.

As illustrated in Table 3, at each junction a certain amount of current VG is applied to the connected match line ML1-ML4. The ON/OFF ratio characterizes the difference between the current conducted by the memristor in the ON state and leaked by the memristor in the OFF state. In various embodiments, comparison current VG can be a match current $V_{search}G_{OFF}$ added to the match line ML1-ML4 to indicate a match, or it can be a mismatch current $V_{search}G_{ON}$, which is the current added to match line ML1-ML4 by a given memory cell G when there is a mismatch. Table 3 illustrates the voltage signal applied to each search line (i.e., the voltage signal on the first search line $SL_{V1}$, the voltage signal on the second search line $SL_{V2}$) and the resistance state to which each of the memory cells G of the TCAM cell are set to store the ternary value (i.e., resistance state of the first memory cell $G_{state1}$, the resistance state of the second memory cell $G_{state2}$).

TABLE 3

| Input ($SL_{V1}$, $SL_{V2}$) | Stored Data ($G_{state1}$, $G_{state2}$) | Output (Match/Mismatch) |
| --- | --- | --- |
| 0 (0, $V_{search}$) | 0 ($G_{ON}$, $G_{OFF}$) | $V_{search}G_{OFF}$ (Match) |
| 1 ($V_{search}$, 0) | 1 ($G_{OFF}$, $G_{ON}$) | $V_{search}G_{OFF}$ (Match) |
| 0 (0, $V_{search}$) | 1 ($G_{OFF}$, $G_{ON}$) | $V_{search}G_{ON}$ (Mismatch) |
| 1 ($V_{search}$, 0) | 0 ($G_{ON}$, $G_{OFF}$) | $V_{search}G_{ON}$ (Mismatch) |
| X (0, 0) | ANY | 0 (Match) |
| ANY | X ($G_{OFF}$, $G_{OFF}$) | $V_{search}G_{OFF}$ or 0 (Match) |

The output represents the current added to a match line ML1-ML4 from a given memory cell G. The output is additive along a match line ML1-ML4. Therefore, for a TCAM with word length of Y, the worst-case scenario is to distinguish between the highest current in a match case and the lowest current in a mismatch case, as represented by the following:

$$I_{match} = V_{search}G_{HRS} \times Y << I_{mismatch\ 1\text{-}bit} = V_{search}G_{LRS} + V_{search}G_{HRS} \times (Y-1), \quad (1)$$

wherein $G_{HRS}$ represents the memory cell G set in the high resistance state (HRS) (which corresponds to $G_{OFF}$) and $G_{LRS}$ represents the memory cell G set in the low resistance state (LRS) (which corresponds to $G_{ON}$).

Therefore, a match is indicated where the current sensed on a match line ML1-ML4 equals (or is less than) the total match current $I_{match}$, and a mismatch is indicated where the current sensed on a match line ML1-ML4 is a current greater than the total match current $I_{match}$. This occurs in some cases where one or more memory cells G apply a mismatch current $V_{search}G_{ON}$ to the match line ML1-ML4. In addition to indicating that a mismatch occurred between the search word and the stored data word, the level of similarity between the two words can be determined from the magnitude of the sensed current. The search voltage $V_{search}$, the mismatch current $V_{search}G_{ON}$, and the match current $V_{search}G_{OFF}$ are known, so it is possible based on equation (1) to identify the amount of total mismatch current $I_{mismatch}$ applied to the match line to determine the number of mismatches between the search word and the data word. In various embodiments, peripheral circuitry in communication with the outputs of the match lines ML1-ML4, either directly or indirectly through other circuit elements (e.g., current sensing circuitry 208) can be included which is capable of identifying the number of mismatches that occurred for a particular data word based on the output sensed current. In some embodiments, encoder 210 can include such circuitry for identifying both that a mismatch occurred and the number of bit mismatches for each data word.

In various embodiments, there may be some variation in the values of the total match current $I_{match}$ and the total mismatch current $I_{mismatch}$. If the match line sensing margin is set too low, the possibility for a false positive increases. The impact of such variation can be minimized by designing the DPE-TCAM with a match line sensing margin such that the total mismatch current $I_{mismatch}$ is several times larger than the total match current $I_{match}$. In various embodiments, the match line sensing margin can be tuned based on a desired match-to-mismatch ratio β. Based on this desired ratio β, a maximum word length with which the DPE-TCAM can be designed to maintain the desired match line sensing margin can be calculated as:

$$N < \frac{G_{LRS}/G_{HRS} - 1}{\beta - 1}. \quad (2)$$

Using equation 2, the match line sensing margin can be tuned based on a desired match-to-mismatch ratio β. In various embodiments, the match-to-mismatch ratio β should be larger than one.

As discussed above, unlike conventionally-designed TCAMs, DPE-TCAMs in accordance with embodiments of the present disclosure are capable of performing both the binary (i.e., total word match/mismatch) search function and a similarity function (i.e., how many mismatches occurred) in the same operation. The circuitry for detecting the number of mismatches may be configured such that DPE-TCAM 200 can be configured to perform a search operation, a similarity operation, or a combination thereof. As a non-limiting example, the peripheral circuitry could include (e.g., current sensing circuitry 208, encoder 210) a transimpedance amplifier (TIA) configured to convert the received current into a voltage signal indicative of the number of mismatches, and an analog-to-digital converter (ADC) to convert the voltage signal into a digital output. In this way, a digital output indicating the number of mismatches (i.e., one-bit mismatch, two-bit mismatch, etc.) can be obtained from the accumulated current (i.e., the total mismatch current $I_{mismatch}$) on the match line during the search operation, enabling the similarity operation to be performed in parallel against the entire stored data and with the binary match operation. In some embodiments, the peripheral circuitry can be designed such that a maximum digital output corresponds to a mismatch cap (e.g., the maximum output indicates four or more mismatches). This mismatch cap can occur by designing the circuit to reach saturation at a current level corresponding to four mismatches, so that any mismatches over the fourth detected mismatch does not change the digital output. Such embodiments can be used to reduce the power required for the DPE-TCAM 200 to operate.

Accordingly, DPE-TCAM 200 can enable searching of much longer words than traditional TCAMs. The configuration of the DPE-TCAM 200 does not suffer some of the word length-limiting problems of transistor-based TCAMs due to the reduced impact of subthreshold leakage and the high density enabled by implementing a memory cell out of a single memristor or other resistive RAM device. Moreover, the total area necessary for performing the TCAM functions with DPE-TCAM 200 is reduced compared to the total amount of area for a TCAM implemented with prior art TCAM cells storing data words of the same length. The TCAM cells 204 can in various embodiments can be constructed three-dimensionally enabling the TCAM crossbar array 202 of DPE-TCAM 200 can be built on top of each other to further increase the density.

Figure 3:
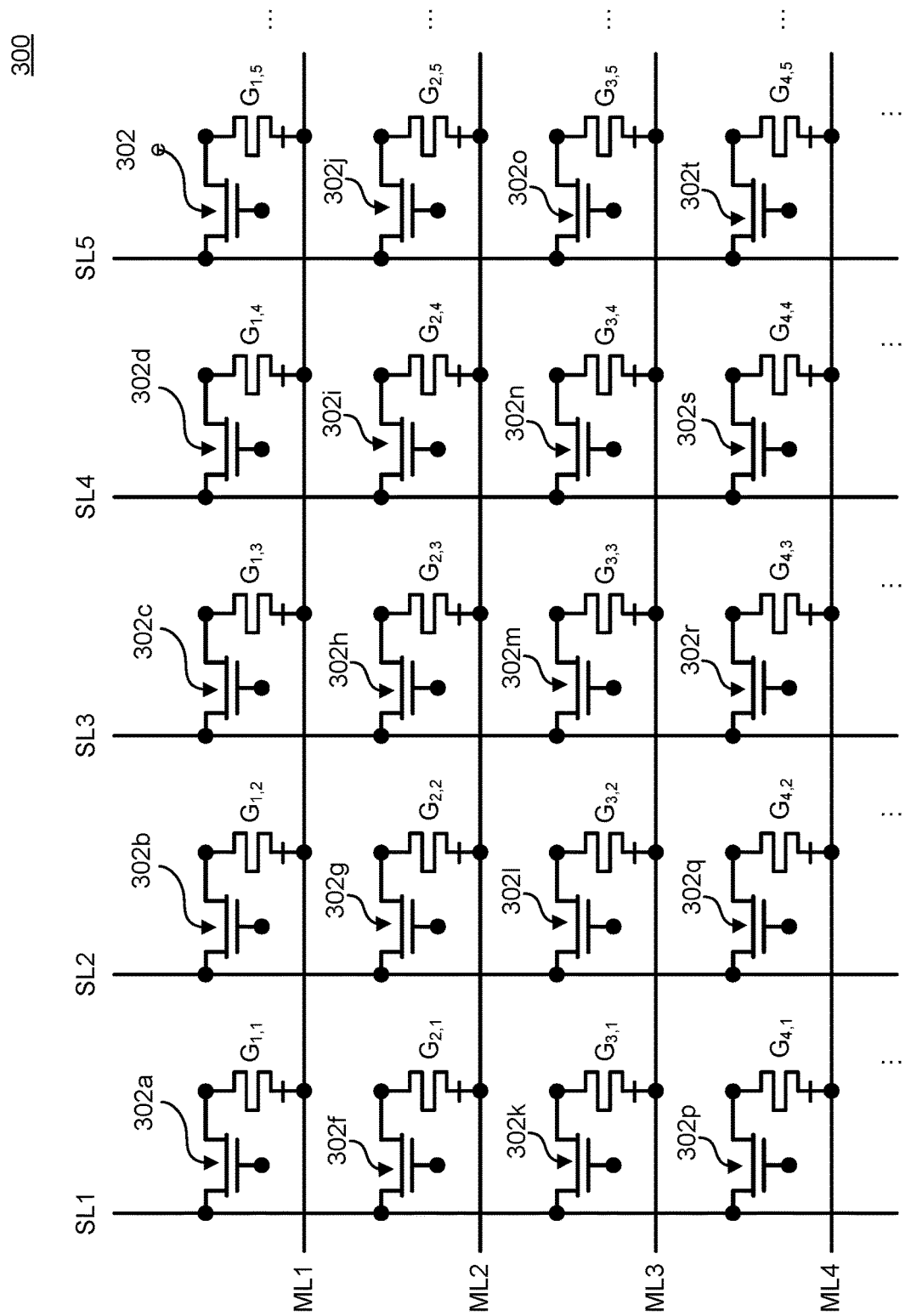
FIG. 3 illustrates an example selector TCAM crossbar array in accordance with embodiments of the technology disclosed herein.

In various embodiments, each memory cell G may include additional circuit elements, including but not limited to transistors or selectors. FIG. 3 illustrates an example selector TCAM crossbar array 300 in accordance with embodiments of the present disclosure. As stated above, every instance of a reference used in a figure should be assumed to be the same, meaning that all discussion of that reference applies to each instance unless stated otherwise. Selector TCAM crossbar array 300 is similar to TCAM crossbar array 202 discussed with respect to FIG. 2, and operates in a similar manner as TCAM crossbar array 202. Selector TCAM crossbar array 300 can be implemented within a TCAM in a similar manner as TCAM crossbar array 202. For ease of discussion, peripheral circuitry (e.g., current sensing circuitry 208 illustrated in FIG. 2) has been omitted, but it should not be interpreted that such omission limits the scope of the technology.

As illustrated in FIG. 3, a select transistor 302 is connected in series between the search line SL and the memory cell G. For example, select transistor 302g is connected to search line SL2 at the source terminal and connected to memory cell $G_{2,2}$ at the drain terminal. Although only select transistors 302a-302t are shown, the number of select transistors 302 can be equal to the number of memory cells G in a given implementation, upwards of N×M select transistors 302. The gate terminal of each select transistor 302 is connected to a gate line (not shown in FIG. 3), which is used to select which select transistors 302 are to be activated. In some embodiments, each stored data word (i.e., each row of memory cells $G_x$) can have a separate gate line connected to the gate terminals of its select transistors 302. For example, each of select transistors 302k-302o can each have their gate terminals connected to the same gate line such that all of the select transistors 302k-302o are activated when a select voltage is applied to the gate line. In other embodiments, each select transistor 302 can have a separate, independent gate line connected to its gate terminal, enabling individual memory cells G to be selected for programming, searching, reading, or any other operation. In still other embodiments, a plurality of select transistors 302 can have their gate terminals connected to the same gate line. As a non-limiting example, select transistors 302a and 302b can both have their gate terminals connected to the same gate line. By doing this, selection can be based on TCAM cells. The use of select transistors 302 enables only specific memory cells G to be active or "on" within selector TCAM crossbar array 300. During search operations, all of the select transistors can be placed in the ON state (i.e., have a voltage applied to all of the gate lines), adding only a small series resistance but enabling all of the memory cells G to be available during the search operation.

In various embodiments, passive selector devices (i.e., non-transistor selectors) may be placed in series with memory cells G in a similar fashion as the select transistors 302 of FIG. 3. As a non-limiting example, a material layer can be added in series between the search line SL and the first end (i.e., top terminal) of the memristor of the memory cell G, with the conductance of the material being controlled by the voltage between a search line SL and a memristor terminal. Non-limiting examples of such materials include mott-insulator transition materials, mixed ionic-electronic conductors (MIECs), volatile conductive bridge materials, or other negative differential resistance materials. Rather than requiring a separate select line as with the select transistors 302, use of a passive selector device is controlled solely by the voltage applied to the passive selector device itself from the search line.

Where the ON/OFF current ratio of the memristors or other resistive RAM devices implemented in the memory cells G is high, the currents $V_{search}G_{OFF}$ and $V_{search}G_{ON}$ are more easily differentiated, allowing for the DPE-TCAM 200 discussed above to identify not only whether a mismatch occurred but also the amount of similarity between the data word and search word. Where the ON/OFF current ratio is limited, however, although a mismatch can be detected the limited ON/OFF ratio makes it difficult to determine the similarity.

Figure 4:
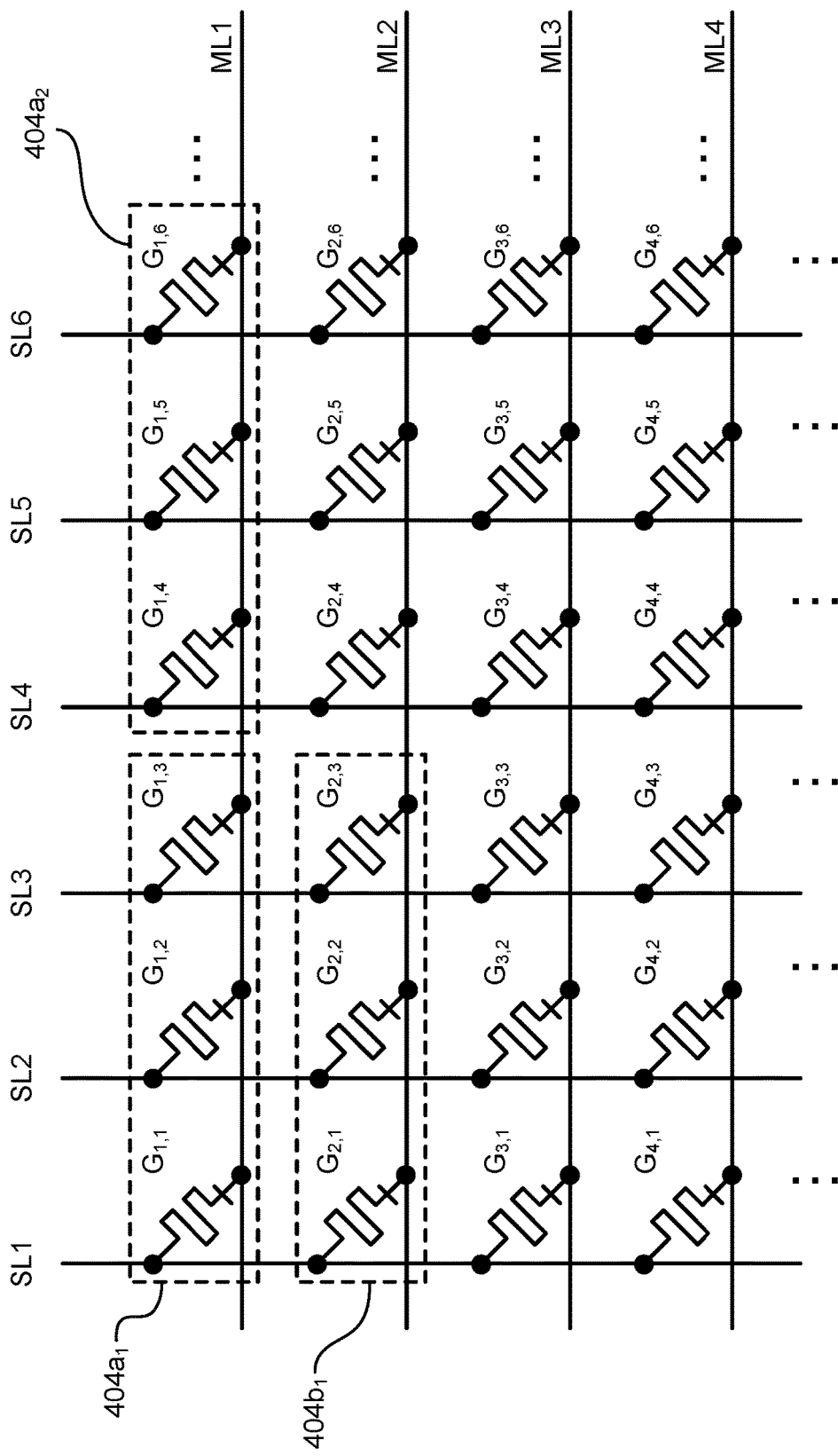
FIG. 4 illustrates another example TCAM crossbar array in accordance with embodiments of the technology disclosed herein.

FIG. 4 illustrates another example TCAM crossbar array 400 in accordance with embodiments of the technology disclosed herein. TCAM crossbar array 400 is the same as TCAM crossbar array 200 discussed with respect to FIG. 2, however each TCAM cell 404 comprises three memory cells G instead of two (i.e., three memory cells $G_1$, $G_2$, $G_3$ are used to represent a single ternary value). For ease of discussion, the peripheral circuitry of DPE-TCAM 200 has been omitted, but a person of ordinary skill in the art would understand that the peripheral circuitry would be present in implementing TCAM crossbar array 400, and that the operation of a DPE-TCAM device implementing TCAM crossbar array 400 would operate in the same manner.

As shown in FIG. 4, each TCAM cell 404 is logically composed of three memory cells G. In this way, the DPE-TCAM implementing TCAM crossbar array 400 allows for balanced encoding of each TCAM cell 404. Balanced encoding refers to the ability to have two voltages of the same magnitude applied to a given TCAM cell 404, each voltage having an opposite polarity. That is, whereas the TCAM cell 204 of FIG. 2 is encoded such that the search voltage $V_{search}$ can be applied to one or the other of the search lines SL associated with the TCAM cell 204, the TCAM cell 404 of FIG. 4 is encoded such that when the search voltage $V_{search}$ is applied to one of the associated search lines SL, a negative search voltage $-V_{search}$ is applied to a second of the associated search lines SL, thereby balancing out the current along the match line ML and resulting in zero current sensed on the match line ML by the current sensing circuitry (omitted in FIG. 4). Table 4 shows the combination of voltages to represent a logical bit value ('0', '1', 'X') as stored in a TCAM cell 404 and applied to each search line $SL_1$, $SL_2$, $SL_3$. The notations in Table 4 are the same as those used and discussed with respect to Table 3. Using three memory cells $G_1$ $G_2$ $G_3$ for one TCAM cell 404 can be implemented for DPE-TCAM devices utilizing memory technology with limited ON/OFF ratios but have uniform discrete states, including but not limited to STT-MRAM and FeFET.

TABLE 4

| Input (SL$_1$, SL$_2$, SL$_3$) | Stored Data (G$_{state1}$, G$_{state2}$, G$_{state3}$) | Output (Match/Mismatch) |
|---|---|---|
| 0 (0, V$_{search}$, −V$_{search}$) | 0 (G$_{ON}$, G$_{OFF}$, G$_{OFF}$) | 0 (Match) |
| 1 (V$_{search}$, −V$_{search}$, 0) | 1 (G$_{OFF}$, G$_{OFF}$, G$_{ON}$) | 0 (Match) |
| 0 (0, V$_{search}$, −V$_{search}$) | 1 (G$_{OFF}$, G$_{OFF}$, G$_{ON}$) | V(G$_{ON}$ − G$_{OFF}$) (Mismatch) |
| 1 (V$_{search}$, −V$_{search}$, 0) | 0 (G$_{ON}$, G$_{OFF}$, G$_{OFF}$) | V(G$_{ON}$ − G$_{OFF}$) (Mismatch) |
| X (0, 0, 0) | ANY | 0 (Match) |
| ANY | X (G$_{OFF}$, G$_{OFF}$, G$_{OFF}$) | 0 (Match) |

As shown in Table 4, use of the negative search voltage −V$_{search}$ enables the dot product output to be essentially zero current in the match case (i.e., either zero current or a small, negligible amount of current considered to be essentially zero). As a non-limiting example, assume that the second bit of the search word (comparand) is a logic '0' and that peripheral circuitry (not shown in FIG. 4) determines that the search line drivers are to output a zero voltage on the fourth search line SL4, the search voltage V$_{search}$ on the fifth search line SL5, and a negative search voltage −V$_{search}$ on the sixth search line SL6 (i.e., input search a "0"). TCAM cell 404a$_2$ is programmed to store a logic '0' (i.e., G$_{ON}$, G$_{OFF}$, G$_{OFF}$). When the search operation is performed, the search line drivers (not shown) drive the identified voltages on the associated search line SL4-SL6, resulting in the "output" of TCAM cell 404a$_2$ being sensed as zero (or near-zero) current on the match line ML1. In various embodiments, the output for a match may not be absolute zero but close enough that the sensed current is negligible and can be assumed to be zero or treated as such by the sense circuitry. When there is a mismatch, the output of a specific TCAM cell 404 comprises a current equal to the difference in current between the voltage applied to a memory cell G in the ON state versus that applied to a memory cell G in the OFF state.

Figure 5:
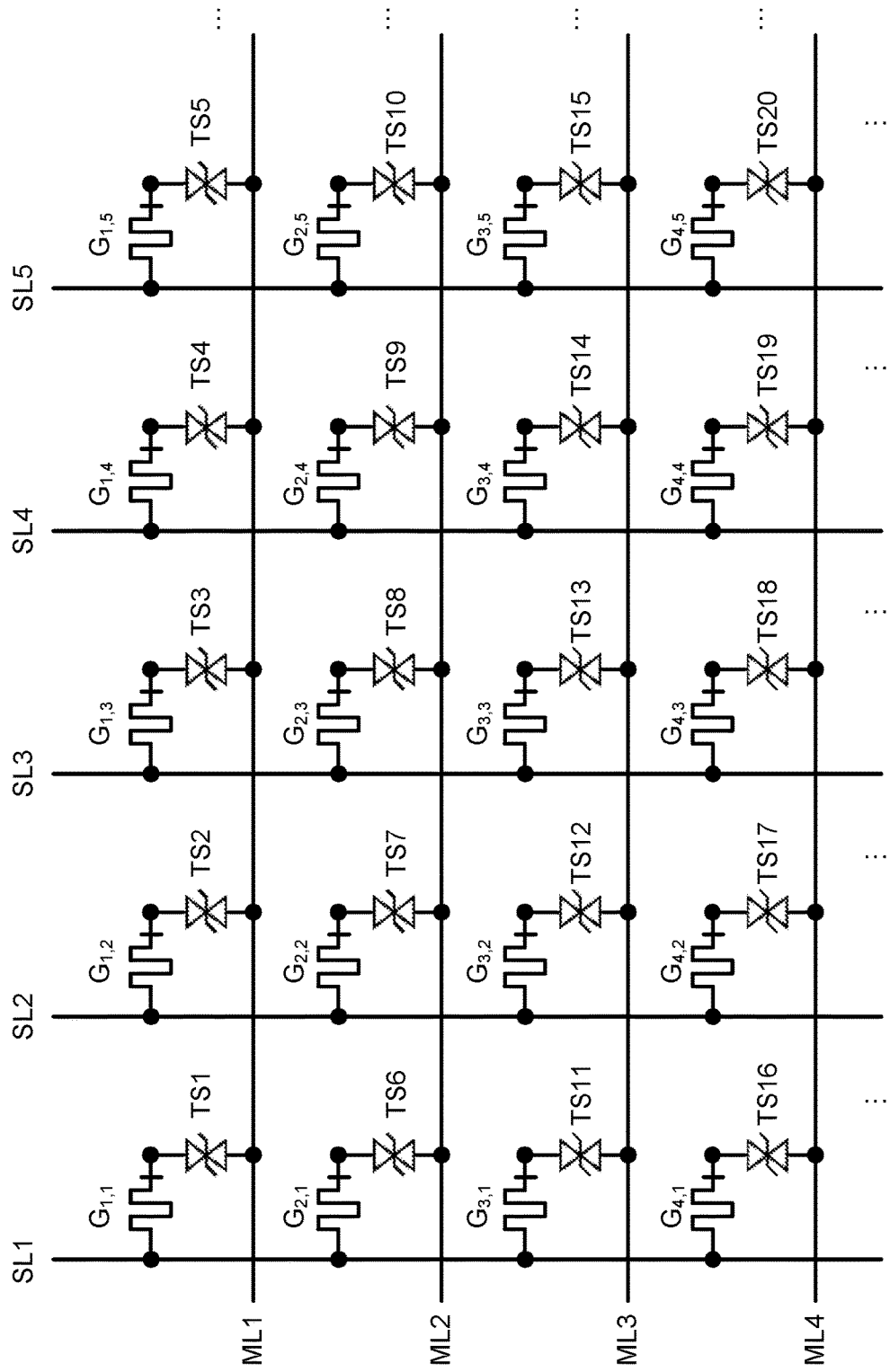
FIG. 5 illustrates another example TCAM crossbar array in accordance with embodiments of the technology disclosed herein.

In various embodiments, other additional circuitry can be included in the TCAM crossbar array of a DPE-TCAM to provide additional functionality. FIG. 5 illustrates another example TCAM crossbar array 500 in accordance with embodiments of the present disclosure. TCAM crossbar array 500 is the same as TCAM crossbar array 200 discussed with respect to FIG. 2, however each TCAM cell 204 has a threshold memristor TS disposed between each memory cell G and the associated match line ML. Threshold memristors TS are disclosed in co-pending U.S. patent application Ser. No. 16/526,455, filed Jul. 30, 2019, which is hereby incorporated by reference herein in its entirety. For ease of discussion, the peripheral circuitry of DPE-TCAM 200 has been omitted, but a person of ordinary skill in the art would understand that the peripheral circuitry would be present in implementing TCAM crossbar array 500, and that the operation of a DPE-TCAM device implementing TCAM crossbar array 500 would operate in the same manner, except that TCAM crossbar array 500 would not be able to identify the number of mismatches that occurred between search bits and stored values.

As illustrated in FIG. 5, each threshold memristor TS comprises a first end connected to the memory cell G and a second end connected to the match line ML. Threshold memristors TS exhibit a significantly smaller conductance swing compared to traditional three-terminal MOSFET transistors. Conductance swing is defined as the ratio between the logarithmical of the conductance change and the change of applied voltage during the conductance switching. For threshold memristors TS, the conductance switching is triggered by a voltage applied to the top electrode (i.e., first end) of the threshold memristor TS. Resistance of the threshold memristor TS is controlled by the voltage from the first end to the second end of the threshold memristor TS. Non-limiting examples of TS memristors include diffusive memristors, metal-insulator transition (MIT) devices, Zener diodes, mixed ionic-electronic conducting (MIEC) devices, among others. Threshold memristors TS also help to reduce the impact of subthreshold leakage compared to traditional three-terminal MOSFET transistors.

Prior to a search being conducted, each threshold memristor TS is in an OFF state (i.e., a high-resistance state) without a current path from a search line SL to a match line ML. As discussed above, during a search operation the match lines ML are not precharged, unlike traditional TCAMs. Rather than a mismatch being indicated by pulling the voltage on a match line ML down, a mismatch is indicated by the threshold memristor TS being switched into the ON state (i.e., low resistance state), creating a current path between the search line SL and the match line ML and pulling the voltage on the match line ML up (and, correspondingly, increasing the current on the match line ML). Accordingly, current sensing circuitry (not shown in FIG. 5) can detect the increased current indicating a mismatch. However, the increased voltage on the match line ML caused by a threshold memristor TS switching to the ON position makes it more difficult for any other threshold memristors TS attached to other memory cells G from turning to the ON state due to the decrease in the voltage drop across the threshold memristors TS. As a non-limiting example, if, during a search operation, a mismatch occurs between the voltage on search line SL3 and memory cell G$_{3,3}$, a voltage is applied to the first end of threshold memristor TS13, resulting in a voltage across threshold memristor TS13 between the first end and the second end that is greater than the threshold voltage of the threshold memristor TS13. This results in threshold memristor TS13 switching to ON, creating a current path between the search line SL3 and the match line ML3, pulling the voltage on match line ML3 up and inducing a current. This increased voltage on match line ML3 makes it more difficult for the other threshold memristors TS11, TS12, TS14, TS15 on match line ML3 from switching to the ON state. Therefore, match line ML3 indicates a mismatch between the search word (comparand) and the stored data word. However, because the other threshold memristors TS11, TS12, TS14, TS15 are not as easily capable of switching ON, it is much more difficult to determine how many mismatches occurred between the search word and the stored data word.

In various embodiments, the number of entries in the DPE-TCAM can include a large number of stored data words (i.e., a large number of row lines Rn). This results in long search lines SL. Due to limited wire resistance, however, voltage drops may occur over the long length of the search lines SL. This can result in misidentifications of mismatches (i.e., false positives) and impact the overall efficiency of the DPE-TCAM. To overcome these effects, the voltage signals along the search lines SL can be buffered by using digital buffers every so often along the length of the search lines SL. In various embodiments, the number of digital buffers required along a given length of the search lines SL can depend on a number of variables, including but not limited to the current level along the search lines SL, the wire resistance of the search lines SL, the size of each TCAM cell (e.g., the number of memory cells comprising a TCAM cell), among others. In various embodiments, the number of digital buffers required can be determined to be the minimum number of digital buffers required to avoid an incorrect output.

Figure 6A:
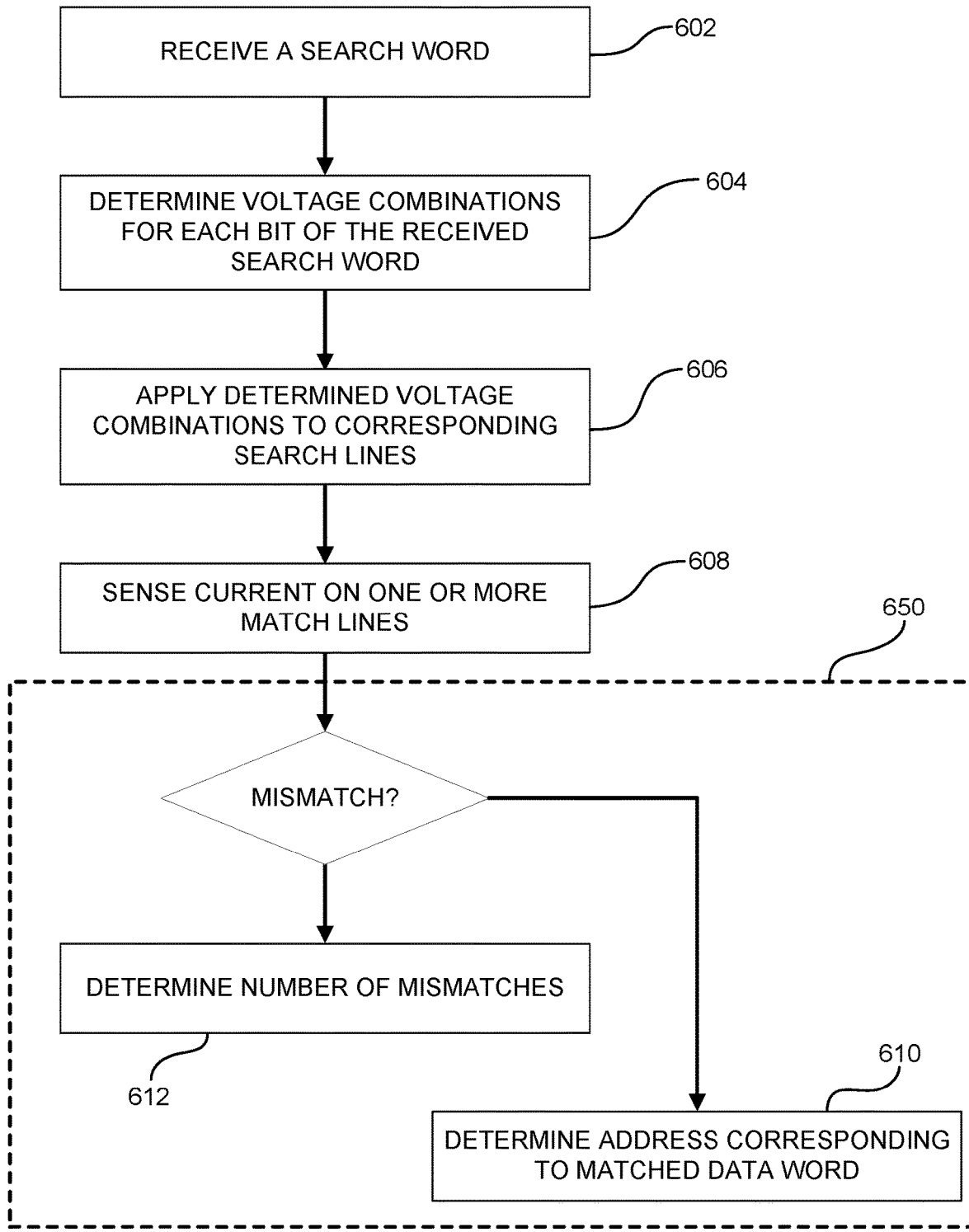
FIG. 6A shows an example method in accordance with embodiments of the technology disclosed herein.

FIG. 6A illustrates an example method 600A in accordance with embodiments of the present disclosure. The example method 600A can be implemented in a DPE-TCAM (similar to those discussed above with respect to FIGS. 2-4) to perform a combination search and similarity operation. Method 600A is provided for illustrative purposes only and should not be interpreted as limiting the scope of the technology to only the illustrative embodiment. At operation 602, a search word (or comparand) is received by the DPE-TCAM. In various embodiments, the search word may be received from one or more processing components of a device or from one or more devices connected to the DPE-TCAM, such as a network route, bridge, switch, computing devices, among other connected devices. In various embodiments, the search word can be received by one or more peripheral circuits of the DPE-TCAM, including but not limited to search line drivers like the search line drivers 206 discussed with respect to FIG. 2.

At operation 604, the combination of voltages representing the value of each bit of the received search word are determined. As discussed above, two or more voltages may be used to represent a logical bit value, such as those discussed above with respect to Tables 1-4. The combinations of voltages represent the voltage signals to be applied to each search line associated with the TCAM cell corresponding to the bit of the search word. At operation 606, the determined combination of voltages is applied to each respective search line, similar to the application of voltages discussed above with respect to FIGS. 2-5.

At operation 608, the current on the one or more match lines of the DPE-TCAM is sensed. As discussed with respect to FIG. 2, the DPE-TCAM can include current sensing circuitry disposed on the output of the match lines. For each match line in DPE-TCAM for which current is sensed, the operations 650 are applied. That is, for each match line, a determination is made about whether a mismatch was detected. As discussed above, a mismatch is detected when the current on the match line is higher than the start of the search and similarity operation or higher than some threshold given the sense circuitry, which is set at zero or a low current state at the start of the search and similarity operation. If no mismatch is detected on the match line, method 600 moves to operation 610 wherein a memory address corresponding to the matched data word is determined. If a mismatch is detected, the number of mismatches is determined at operation 612. The number of mismatches provides an indication of the degree of similarity between the search word and the stored data word associated with the match line. In various embodiments, the operations 650 can be performed by the current sensing circuitry, an encoder connected to the output of the TCAM crossbar array, or a combination of both.

Figure 6B:
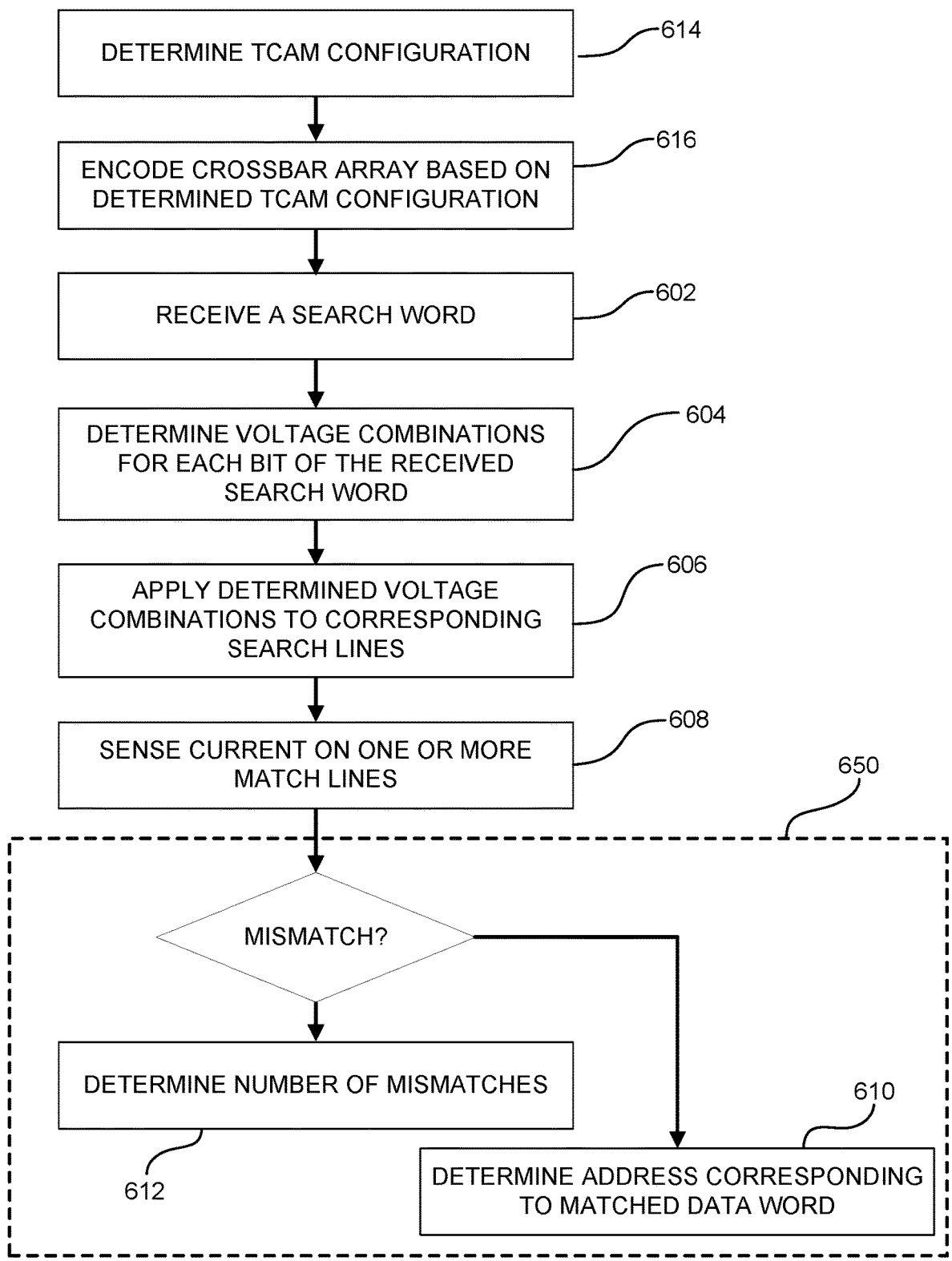
FIG. 6B shows another example method in accordance with embodiments of the technology disclosed herein.

As discussed above, embodiments of the present disclosure provide systems and methods for programming a crossbar array (e.g., a dot product engine) to function as a TCAM, without the need to abide by conventional TCAM design constraints. In this way, common issues with respect to TCAM designs, such as high power consumption (due to the large number of power-hungry transistors required), large area (also due to the large number of transistors required to provide both storage and comparison functionality), and limited word length (due to the increased risk of erroneous mismatch detection caused by the additive, non-zero sub-threshold current leakage of traditional pull-down transistor designs), can be avoided or minimized, providing greater flexibility and efficiency in providing TCAM functionality. Moreover, as discussed with respect to FIGS. 2 and 4, different configurations of TCAM cells (i.e., two- or three-memory cell-sized TCAM cells) can provide different benefits, based on the particular type of resistive RAM devices utilized. FIG. 6B illustrates another example method 600B in accordance with embodiments of the present disclosure. Method 600B is similar to method 600A, including the same operations 602-612 discussed with respect to FIG. 6A. However, method 600B starts by first determining a TCAM configuration at operation 614. Determining the TCAM configuration can comprise detecting the ON/OFF ratio of the resistive RAM devices comprising each memory cell of the crossbar array. As discussed above with respect to FIGS. 2 and 4, different TCAM configurations are best suited for different ON/OFF ratio characteristics of the implemented resistive RAM devices. In various embodiments, operation 614 can be performed by control circuitry, such as control circuitry 212 discussed with respect to FIG. 2 above.

After determining the TCAM configuration suitable for a given ON/OFF ratio, the crossbar array can be programmed or encoded to correspond to the determined TCAM configuration at operation 616. By encoding the crossbar array at operation 616, a TCAM crossbar array (like the TCAM crossbar arrays discussed with respect to FIGS. 2 and 4) is created. In various embodiments, programming or encoding the crossbar array at operation 616 can be conducted in a manner similar to programming of the dot product engine to perform vector-matrix multiplication as described in U.S. Pat. No. 10,262,733, issued on Apr. 16, 2019, co-pending U.S. patent application Ser. No. 15/570,980, filed Sep. 25, 2015, and co-pending U.S. Patent Application No. 2019/0066780, filed Feb. 19, 2016, each of which is hereby incorporated by reference herein in their entirety. After creating the TCAM crossbar array at operation 616, method 600B moves to operation 602 and proceeds in the manner described with respect to method 600A of FIG. 6A.

Figure 7:
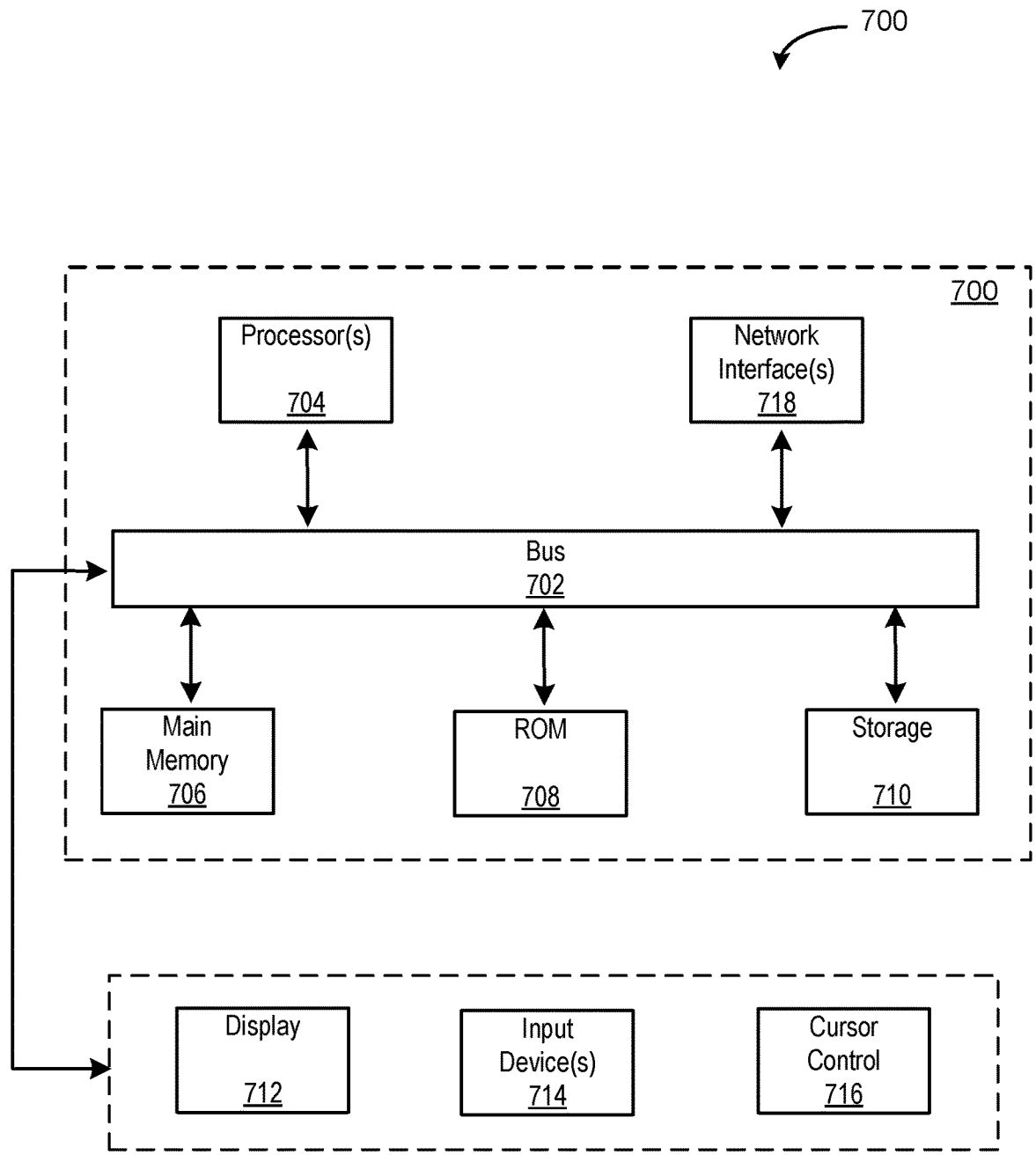
FIG. 7 is an example computing component that may be used to implement various features of embodiments described in the present disclosure.

FIG. 7 depicts a block diagram of an example computer system 700 in which various of the embodiments described herein may be implemented. The computer system 700 includes a bus 702 or other communication mechanism for communicating information, one or more hardware processors 704 coupled with bus 702 for processing information. Hardware processor(s) 704 may be, for example, one or more general purpose microprocessors.

The computer system 700 also includes a main memory 706, such as a random access memory (RAM), cache and/or other dynamic storage devices, coupled to bus 702 for storing information and instructions to be executed by processor 704. Main memory 706 also may be used for storing temporary variables or other intermediate information during execution of instructions to be executed by processor 704. As a non-limiting example, main memory 706 can include non-transitory machine-readable instructions that, when executed by processor 704, causes processor 704 to perform the operations discussed above with respect to FIGS. 2-5 and 6A-6B. Such instructions, when stored in storage media accessible to processor 704, render computer system 700 into a special-purpose machine that is customized to perform the operations specified in the instructions.

The computer system 700 further includes a read only memory (ROM) 708 or other static storage device coupled to bus 702 for storing static information and instructions for processor 704. A storage device 710, such as a magnetic disk, optical disk, or USB thumb drive (Flash drive), etc., is provided and coupled to bus 702 for storing information and instructions.

The computer system 700 may be coupled via bus 702 to a display 712, such as a liquid crystal display (LCD) (or touch screen), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. In some embodiments, the same direction information and command selections as cursor control may be implemented via receiving touches on a touch screen without a cursor.

The computing system 700 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor(s) 704 executing one or more sequences of one or more instructions contained in main memory 706. Such instructions may be read into main memory 706 from another storage medium, such as storage device 710. Execution of the sequences of instructions contained in main memory 706 causes processor(s) 704 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 710. Volatile media includes dynamic memory, such as main memory 706. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 702. Transmission media can also take the form of acoustic or light waves, such as those generated during radio-wave and infra-red data communications.

The computer system 700 also includes a communication interface 718 coupled to bus 702. Network interface 718 provides a two-way data communication coupling to one or more network links that are connected to one or more local networks. For example, communication interface 718 may be an integrated services digital network (ISDN) card, cable modem, satellite modem, or a modem to provide a data communication connection to a corresponding type of telephone line. As another example, network interface 718 may be a local area network (LAN) card to provide a data communication connection to a compatible LAN (or WAN component to communicated with a WAN). Wireless links may also be implemented. In any such implementation, network interface 718 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 718, which carry the digital data to and from computer system 700, are example forms of transmission media.

The computer system 700 can send messages and receive data, including program code, through the network(s), network link and communication interface 718. In the Internet example, a server might transmit a requested code for an application program through the Internet, the ISP, the local network and the communication interface 718.

The received code may be executed by processor 704 as it is received, and/or stored in storage device 710, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 700.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A dot product engine ternary content addressable memory (DPE-TCAM) comprising:
    a TCAM crossbar array comprising:
        a plurality of match lines,
        a plurality of search lines, and
        a plurality of memory cells, each memory cell configured to couple a search line of the plurality of search lines and a match line of the plurality of match lines;
    a plurality of search line drivers, each search line driver configured to apply a voltage signal to an associated search line of the plurality of search lines; and
    a current sensing circuitry coupled to an output of each match line of the plurality of match lines,
    wherein the current sensing circuitry is configured to detect a mismatch on a respective match line of the plurality of match lines between a search word represented by a plurality of voltage signals applied by the plurality of search line drivers and a data word stored in a set of TCAM cells associated with the respective match line, each TCAM cell comprising a set of memory cells of the plurality of memory cells.

2. The DPE-TCAM of claim 1, further comprising an encoder communicatively coupled to the current sensing circuitry coupled to each match line of the plurality of match lines, the encoder configured to, in response to detecting a match on a match line, generate an address corresponding to a data word stored in the set of TCAM cells associated with the match line.

3. The DPE-TCAM of claim 1, wherein each TCAM cell comprises two memory cells of the plurality of memory cells, wherein the two memory cells are programmed to represent a single ternary value of a data word.

4. The DPE-TCAM of claim 3, wherein:
    a TCAM cell represents a logic '0' when a first memory cell is set in a low resistance state and a second memory cell is set in a high resistance state;
    a TCAM cell represents a logic '1' when a first memory cell is set in a high resistance state and a second memory cell is set in a low resistance state; and
    a TCAM cell represents a wildcard bit when the two memory cells are set in a high resistance state.

5. The DPE-TCAM of claim 1, wherein each TCAM cell comprises three memory cells of the plurality of memory cells, wherein the three memory cells are programmed to represent a single ternary value of a data word.

6. The DPE-TCAM of claim 5, wherein:
    a TCAM cell represents a logic '0' when a first memory cell is set in a low resistance state and a second and third memory cells are set in a high resistance state;
    a TCAM cell represents a logic '1' when a first and second memory cells are set in a high resistance state and a third memory cell is set in a low resistance state; and
    a TCAM cell represents a wildcard bit when the three memory cells are set in a high resistance state.

7. The DPE-TCAM of claim 1, wherein the current sensing circuitry is further configured to detect a number of mismatches detected on a given match line based on an accumulated current on the given match line.

8. The DPE-TCAM of claim 1, further comprising a selector device disposed between a search line of the plurality of search lines and a first end of a memory cell of the plurality of memory cells.

9. The DPE-TCAM of claim 8, wherein the selector device comprises one of a select transistor or a non-transistor selector device.

10. The DPE-TCAM of claim 1, wherein the current sensing circuitry comprises a transimpedance amplifier (TIA) configured to convert a received current into the voltage signal indicative of the number of mismatches, and an analog-to-digital converter (ADC) to convert the voltage signal into the output.

11. A method comprising:
receiving, by a plurality of search line drivers, a search word;
determining, by the plurality of search line drivers, a plurality of voltage combinations, each voltage combination associated with a single bit of the received search word;
applying, by the plurality of search line drivers, the plurality of voltage combinations to a plurality of search lines, each voltage combination defining a voltage signal to apply to a search line of a group of search lines;
sensing, by a plurality of current sensing circuitry, a current on a plurality of match lines; and
in response to detecting a mismatch between at least one bit of the search word and a data word stored in a plurality of ternary content addressable memory (TCAM) cells along a match line of the plurality of match lines, determining, by the current sensing circuitry, a number of mismatches between a plurality of bits of the search word and a plurality of bits of the data word,
wherein each TCAM cell comprises a group of memory cells, each memory cell coupling a search line of a group of search lines to the match line of the plurality of match lines.

12. The method of claim 11, further comprising, in response to not detecting a mismatch between any bit of the search word and the data word stored in the plurality of TCAM cells along a match line of the plurality of match lines, determining, by an encoder, an address corresponding to the data word.

13. The method of claim 11, wherein a mismatch is detected when a TCAM cell of the plurality of TCAM cells along a match line is programmed to store a bit value different from a bit value represented by a voltage combination applied to a group of search lines corresponding to the TCAM cell.

14. The method of claim 11, wherein the group of memory cells of a TCAM cell comprises two resistive random access memory (RAM) devices, a first resistive RAM device coupling a first search line of a group of search lines to a common match line and a second resistive RAM device coupling a second search line of the group of search lines to the common match line.

15. The method of claim 14, wherein each voltage signal of the voltage combinations can be either a search voltage or a zero voltage, and wherein:
a voltage combination comprising a first voltage signal equivalent to the search voltage and a second voltage signal equivalent to the zero voltage represents a logic '1';
a voltage combination comprising a first voltage signal equivalent to the zero voltage and a second voltage signal equivalent to the search voltage represents a logic '0'; and
a voltage combination comprising a first voltage signal and a second voltage signal equivalent to the zero voltage represents a wildcard bit.

16. The method of claim 14, wherein a mismatch is detected when a current on a match line is greater than a match current.

17. The method of claim 11, wherein the group of memory cells of a TCAM cell comprises three resistive RAM devices, a first resistive RAM device coupling a first search line of a group of search lines to a common match line, a second resistive RAM device coupling a second search line of the group of search lines to the common match line, and a third resistive RAM device coupling a third search line of the group of search lines to the common match line.

18. The method of claim 17, wherein each voltage signal of the voltage combinations can be either a search voltage, a negative search voltage, or a zero voltage, and wherein:
a voltage combination comprising a first voltage signal equivalent to the search voltage, a second voltage signal equivalent to the negative search voltage, and a third voltage signal equivalent to the zero voltage represents a logic '1';
a voltage combination comprising a first voltage signal equivalent to the zero voltage, a second voltage signal equivalent to the search voltage, and a third voltage signal equivalent to the negative search voltage represents a logic '0'; and
a voltage combination comprising a first voltage signal, a second voltage signal, and a third voltage signal equivalent to the zero voltage represents a wildcard bit.

19. A method comprising:
determining, by control circuitry, a ternary content addressable memory (TCAM) configuration;
encoding, by the control circuitry, a crossbar array based on the determined TCAM configuration;
receiving, by a plurality of search line drivers, a search word;
determining, by the plurality of search line drivers, a plurality of voltage combinations, each voltage combination associated with a single bit of the received search word;
applying, by the plurality of search line drivers, the plurality of voltage combinations to a plurality of search lines, each voltage combination defining a voltage signal to apply to a search line of a group of search lines;
sensing, by a plurality of current sensing circuitry, a current on a plurality of match lines; and
in response to detecting a mismatch between at least one bit of the search word and a data word stored in a plurality of TCAM cells along a match line of the plurality of match lines, determining, by the current sensing circuitry, a number of mismatches between a plurality of bits of the search word and a plurality of bits of the data word,
wherein each TCAM cell comprises a group of memory cells, each memory cell coupling a search line of a group of search lines to the match line of the plurality of match lines.

20. The method of claim 19, wherein determining the TCAM configuration comprises determining a size of each TCAM cell of a plurality of TCAM cells representing a data word, the size of each TCAM cell comprising two memory cells of the crossbar array or three memory cells of the crossbar array.

* * * * *